(12) United States Patent
Schilling

(10) Patent No.: US 6,624,042 B2
(45) Date of Patent: Sep. 23, 2003

(54) FABRICATION PROCESS FOR A SEMICONDUCTOR COMPONENT

(75) Inventor: Uwe Schilling, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/893,352

(22) Filed: Jun. 27, 2001

(65) Prior Publication Data
US 2002/0030240 A1 Mar. 14, 2002

(30) Foreign Application Priority Data
Jun. 28, 2000 (DE) .......................... 100 32 795

(51) Int. Cl.$^7$ .............................. H01L 21/76

(52) U.S. Cl. ...................................... 438/424

(58) Field of Search ......................... 438/424

(56) References Cited

U.S. PATENT DOCUMENTS 6,319,788 B1 * 11/2001 Gruening et al.
6,413,835 B1 * 7/2002 Norstrom et al.

FOREIGN PATENT DOCUMENTS

DE         19827686         12/1999    ....... H01L/21/8242

* cited by examiner

*Primary Examiner*—John F. Niebling
*Assistant Examiner*—Stanetta Isaac
(74) *Attorney, Agent, or Firm*—Fish & Richardson P.C.

(57) ABSTRACT

A process for fabricating a semiconductor component includes providing a trench in a substrate and depositing a liner layer on the resulting structure using a nonconformal deposition process. This results in the liner layer being significantly smaller at the trench walls and base than on the substrate surface. An insulating layer is provided on the resulting structure by a conformal deposition process. The insulating layer is then anisotropically etched to remove the insulating layer from a region of the trench base.

5 Claims, 3 Drawing Sheets

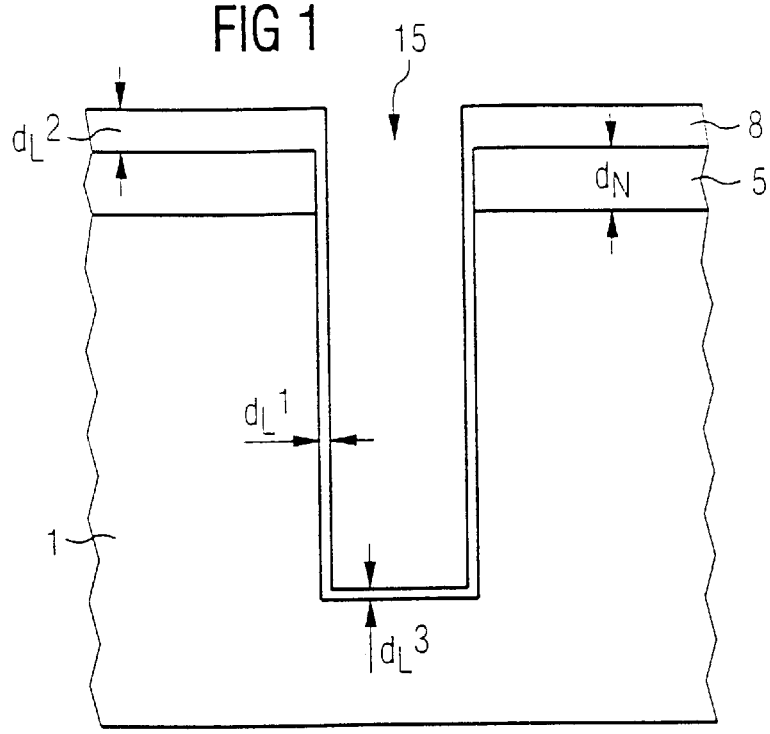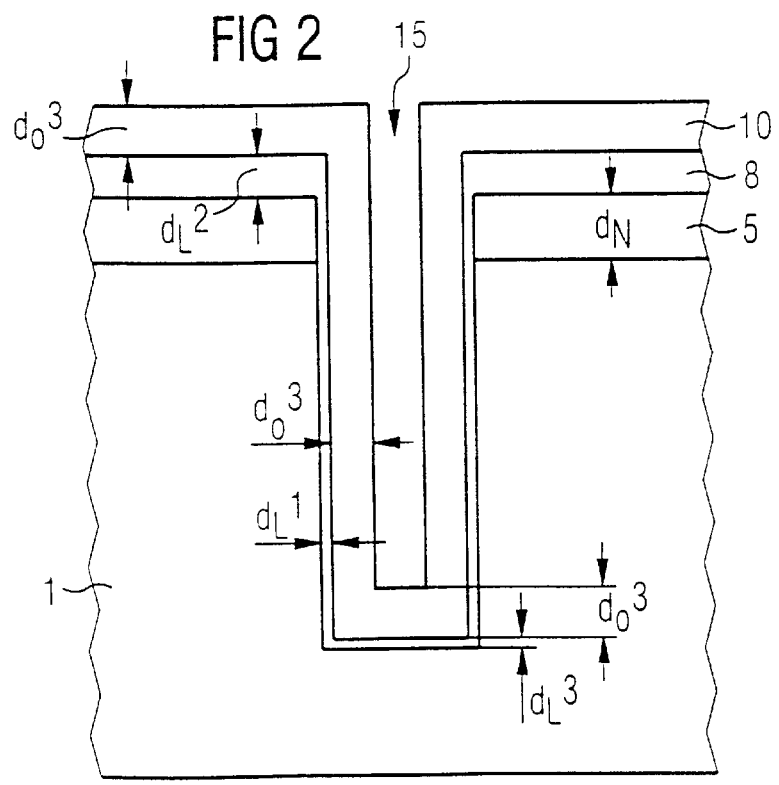

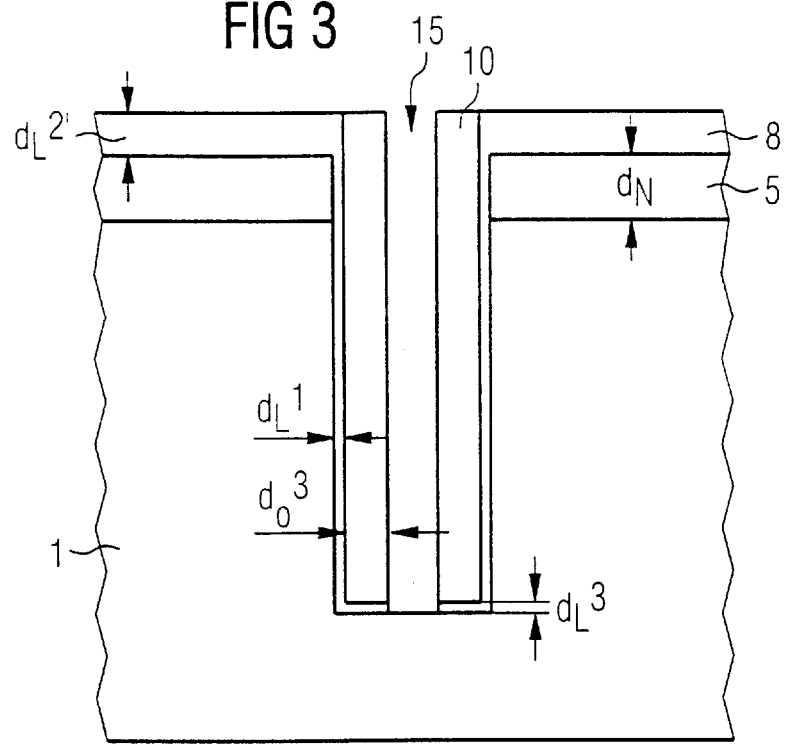
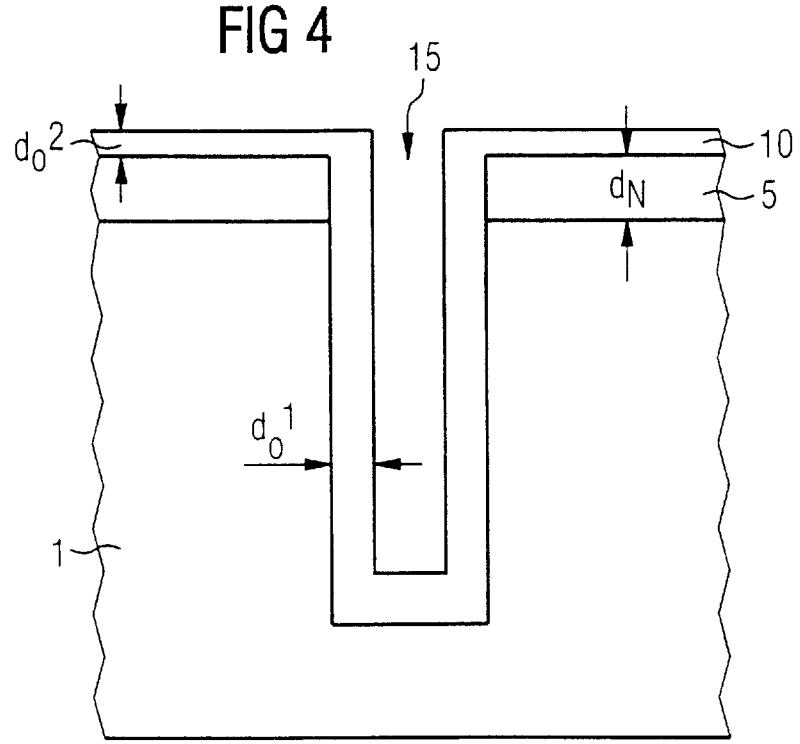

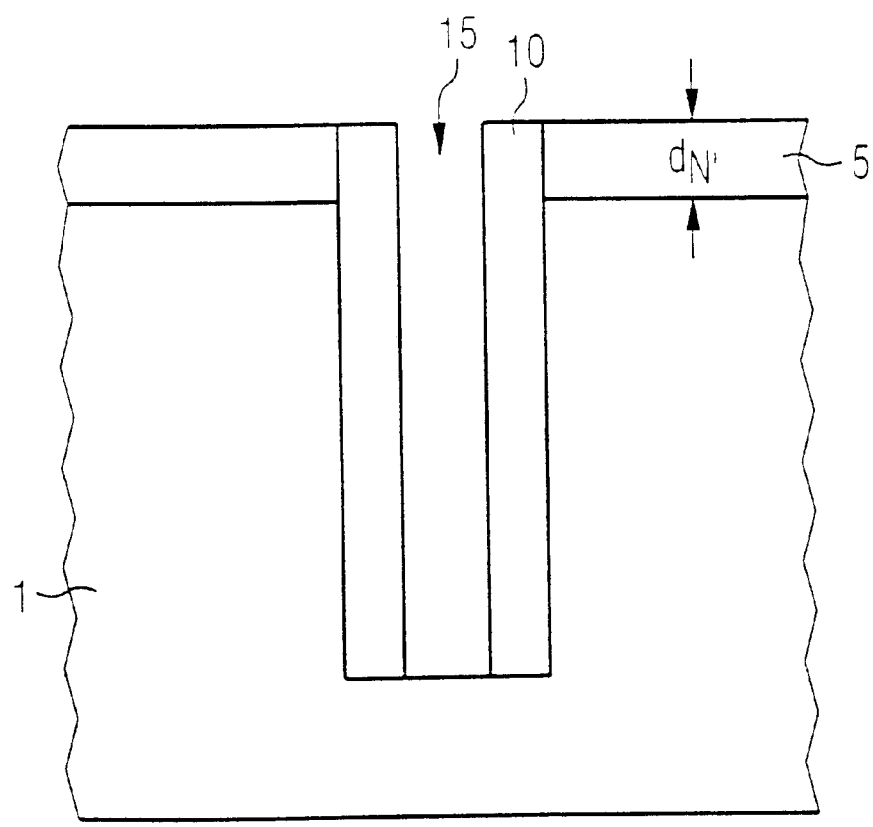

FABRICATION PROCESS FOR A SEMICONDUCTOR COMPONENT

FIELD OF THE INVENTION

The present invention relates to a semiconductor component having a substrate and a trench which is provided in the substrate. The invention also relates to a corresponding fabrication process.

BACKGROUND

The term substrate is to be understood in a general sense and may therefore cover both single-layer and multilayer substrates.

Although it can be applied to any desired semiconductor components, the present invention and the problems on which it is based are explained in the context of a trench capacitor having an insulation collar.

FIGS. 4–5 diagrammatically depict the essential process steps involved in the fabrication of a known semiconductor component.

In FIG. 4, 1 denotes a semiconductor substrate made from silicon, on the surface of which a nitride layer 5 with a thickness $d_N$ is provided, this layer serving as a hard mask layer for the etching of the trench 15. The hard mask used is a significantly thicker oxide layer, which at this point has already been removed again.

In the known trench capacitor process, it is necessary to provide an oxide layer 10 on the vertical trench walls. For this purpose, it is customary to carry out a relatively conformal deposition, for example with ozone TEOS oxide, or ozone TEOS for short (i.e. oxide which is produced using ozone and TEOS), leading to the structure shown in FIG. 4.

As can be seen from FIG. 4, the deposition is conformal but surface-selective. This means that the ozone TEOS grows at different rates on different surfaces, the result being slower layer growth, to form a thickness $d_0^2$, on silicon nitride than on silicon dioxide, which in turn produces growth which is slower than that which is found on the silicon substrate (layer thickness $d_0^1$).

In this case, as in other cases, however, a greater layer thickness is desired on the substrate surface, in this case on the nitride layer 5, than on the trench base. However, since the nitride is situated on the substrate surface and silicon or silicon dioxide is situated on the trench base, this is not possible.

This is to be seen in connection with the following process steps, which are shown in FIG. 5. As shown in FIG. 5, in fact, the ozone TEOS layer 10 is removed from the trench base using an anisotropic etching step. However, in this case this step is impossible without attacking the surface of the nitride layer 5, which leads to a reduced thickness $D_{N'}$ of the nitride layer 5.

Therefore, this prior art does not allow thick deposition of ozone TEOS 10 on the raised horizontal surfaces, so that corresponding oxide residues can be reliably removed from the trench base by anisotropic etching without the structures on the substrate topside being attacked.

Therefore, it has hitherto been necessary to accept a high nitride loss during etching. The etching also took place partially selectively, with either a polymer or an oxide being deposited on the nitride layer 5. Consequently, although it is possible to overetch for longer without reducing the thickness of the nitride layer 5, the topside of the side wall also undergoes undercut etching during the overetching, and furthermore the polymer or oxide has to be removed again in a further step.

Furnace deposition of the silicon dioxide, which is not surface-selective, is also possible. However, the layer thickness on the structure cannot be set independently of that on the side wall. Moreover, furnace deposition processes stretch the available temperature balance. Furthermore, furnace deposition processes which are set in such a manner that they deposit more on the surface than in the trenches produce oxide layer thicknesses which on the side walls drop from the top downward.

SUMMARY

The object on which the present invention is based is that of providing optimum layer thickness conditions for the etching.

According to the present invention, it is possible to create a thin insulating layer, e.g. $SiO_2$, on the base, a thicker insulating layer on the side wall and an even thicker insulating layer on the substrate topside. Consequently, the etching, for example by using an end point, can be realized in such a way that at the end of etching the base between the structures is etched without any residues, yet nevertheless the topside of the structures is not attacked. Vertical surfaces have insulating layer thicknesses which remain substantially constant over their entire length and, after the etching, extend all the way to the surface of the structures.

The general idea on which the present invention is based consists in providing a suitable liner layer which enables the thickness growth of the insulating layer to be suitably controlled. The liner is expediently deposited at high pressure, preferably between 15 and 35 torr, which enables the deposition to be highly nonconformal, so that a significantly thicker insulating layer is formed on the substrate surface than on the trench walls and on the trench base; by varying the deposition time of the liner and of the insulating layer, it is possible to set the ratio between the layers on horizontal and vertical surfaces independently of one another and within wide ranges.

According to one preferred refinement, the substrate is a silicon substrate and the insulating material is silicon dioxide.

According to another preferred refinement, the layer of the insulating material has been applied by an ozone TEOS process. The desired thickness ratios can easily be achieved by a plasma oxide liner which is deposited before the ozone TEOS process. The liner deposition may take place in situ in the same process chamber as that in which the ozone TEOS is deposited. This is in any case expedient in the known process, since the chamber is cleaned with plasma after the ozone TEOS deposition (i.e. without wafers).

According to a further preferred refinement, a nitride layer, which is covered by the liner layer at least in regions, is provided on the substrate topside.

According to a further preferred refinement, the liner layer is removed from the trench base at least in regions.

An exemplary embodiment of the invention is illustrated in the drawings and explained in more detail in the description which follows. In the drawings:

FIGS. 1–3 show a diagrammatic illustration of the essential process steps involved in the fabrication of a semiconductor component as an embodiment of the present invention; and FIGS. 4–5 diagrammatically depict the essential process steps involved in the fabrication of a known semiconductor component.

DETAILED DESCRIPTION

FIGS. 1–3 show a diagrammatic illustration of the essential process steps involved in the fabrication of a semiconductor component as an embodiment of the present invention.

As shown in FIG. 1, an oxide liner layer 8 is deposited on the trench structure provided with the nitride layer 5 using an anisotropic plasma process at a pressure of, for example, 25 torr, in such a manner that the layer thickness $d_L^1$ of the liner layer 8 on the trench base and on the trench side walls is significantly smaller than the layer thickness $d_L^2$ on the substrate surface on the nitride layer 5.

This is achieved by using directed plasma deposition, and the nonconformity of this deposition means that it scarcely covers the trench base and the trench side walls. In this context, it should be noted that the difference in thickness between the liner layer 8 and the nitride layer 5 is not to scale in the drawing, for reasons of clarity. In reality, the layer thickness $d_L^2$ of the liner layer 8 is typically of the order of magnitude of 25 nm, while the layer thickness $d_L^1$ of the liner layer 8 on the trench wall is typically of the order of magnitude of 2.5 nm, and the layer thickness $d_L^3$ of the liner layer 8 on the trench base is typically of the order of magnitude of 15 nm. By contrast, the layer thickness of the nitride layer is typically in the region of 200 nm.

In a further process step, as shown in FIG. 2, the ozone TEOS deposition is carried out in situ in the same process chamber, and an ozone TEOS layer 10 with substantially the same layer thickness $d_O^3$ of typically 20 to 40 nm is deposited on the substrate surface, the trench side walls and the trench base.

In the following process step, which is illustrated in FIG. 3, a known anisotropic etching process is then used to expose the trench base, i.e. the liner layer 8 and the ozone TEOS layer 10 are removed at the trench base. As part of this step, the layer thickness of the liner layer on the substrate surface is reduced from $d_L^2$ to $d_L^{2\prime}$. This means that the nitride layer 5 is not attacked by the etching process, since a residual layer thickness of the liner layer 8 remains on the nitride layer 5. Another possibility would be end point detection when the nitride layer 5 is reached.

Although the present invention has been described above on the basis of a preferred exemplary embodiment, it is not restricted to this, but rather can be modified in numerous ways.

In particular, the substrate is not restricted to a silicon substrate, but rather it is also possible to use suitable other semiconductor materials or material sandwiches as the substrate.

Although the present invention has been described above on the basis of a (deep) trench with an insulation collar for the DRAM or embedded DRAM process, the invention is not restricted to this process. In particular, the invention may also be used for spacer deposition for the definition of implantation regions and inlay deposition for the modification of structure widths.

What is claimed is:

1. A process for fabricating a semiconductor component, said process comprising:

providing a trench in a substrate having a substrate surface, said trench and substrate defining a first resulting structure;

depositing a liner layer on said resulting structure, using a nonconformal deposition process, such that a thickness of said liner layer on said trench wall and a thickness of said liner layer on said trench base are both significantly smaller than a thickness of said liner layer on said substrate surface, thereby forming a second resulting structure;

providing an insulating layer made of an insulating material on said second resulting structure by means of a conformal deposition process such that a thickness of said liner layer on said trench wall and a thickness of said liner layer on said trench base are essentially the same as a thickness of said insulating layer on said substrate surface; and anisotropically etching said insulating layer and said liner layer to remove said insulating layer and said liner layer from a region of the trench base such that a thickness of said substrate surface is reduced from a first thickness to a second thickness.

2. The process of claim 1, further comprising providing a nitride layer on said substrate surface, beneath said liner layer.

3. The process of claim 1, wherein depositing a liner layer comprises applying a plasma process at a pressure lying in a range between approximately 15 torr and approximately 35 torr.

4. The process of claim 1, further comprising:

selecting said substrate to be a silicon substrate;

selecting said insulating material to be silicon dioxide; and applying said insulating layer by an ozone TEOS process.

5. The process of claim 1, wherein:

depositing said liner layer comprises depositing said liner layer in situ in a deposition chamber; and depositing said insulating layer comprises depositing said insulating layer in situ in a deposition chamber.

* * * * *